United States Patent [19]
Raabe et al.

[11] Patent Number: 4,994,348
[45] Date of Patent: Feb. 19, 1991

[54] LIGHT-SENSITIVE RECORDING MATERIALS FOR PRODUCING MAR-RESISTANT INTAGLIO PRINTING PLATES

[75] Inventors: Eleonore Raabe, Ludwigshafen; Erich Beck, Harthausen, both of Fed. Rep. of Germany

[73] Assignee: BASF Aktiengesellschaft, Ludwigshafen, Fed. Rep. of Germany

[21] Appl. No.: 315,119

[22] Filed: Feb. 24, 1989

[30] Foreign Application Priority Data

Feb. 27, 1988 [DE] Fed. Rep. of Germany ....... 3806270

[51] Int. Cl.$^5$ ..................... G03F 7/028; G03F 7/033; G03F 7/037
[52] U.S. Cl. .................................. 430/287; 430/281; 430/307; 430/961; 522/102; 522/101; 522/100
[58] Field of Search .............. 430/307, 961, 281, 287; 522/102, 101, 100

[56] References Cited

U.S. PATENT DOCUMENTS 3,770,602 11/1973 D'Alelio ............................ 522/100
3,782,939 1/1974 Bonham et al.
3,891,443 6/1975 Halpern et al.
4,221,892 9/1980 Baron et al. .................... 522/103 X
4,548,894 10/1985 Lynch et al. .................... 430/961 X
4,560,636 12/1985 Stahlhofen.
4,703,338 10/1987 Sagami et al. ................... 522/103 X

FOREIGN PATENT DOCUMENTS 47-41361 2/1972 Japan.
1367921 9/1974 United Kingdom.
1544748 4/1979 United Kingdom.

OTHER PUBLICATIONS

*Chemical Abstracts*, vol. 104, No. 1882945, 1974.
*Chemical Abstracts*, vol. 81, entry 264743, 1974.

Primary Examiner—Cynthia Hamilton
Attorney, Agent, or Firm—Keil & Weinkauf

[57] ABSTRACT

A light-sensitive recording material for the production of intaglio printing plates comprises a photopolymerizable and/or photocrosslinkable material which is soluble or dispersible in a developer liquid and on exposure to actinic light is rendered insoluble or no longer dispersible in this developer liquid and which, at least in a surface zone of the surface of the layer which forms the later surface of the printing plate, contains finely divided abrasive particles whose average particle size is within the range from 0.1 to 6 μm, which have a hardness of >4.0 on the Mohs hardness scale, the surface of the layer which forms the later surface of the printing plate has a peak-to-valley height of <2 μm, and the photocrosslinkable and/or photopolymerizable material contains a reaction product of a cycloaliphatic epoxy with acrylic acid or methacrylic acid.

7 Claims, No Drawings

LIGHT-SENSITIVE RECORDING MATERIALS FOR PRODUCING MAR-RESISTANT INTAGLIO PRINTING PLATES

The present invention relates to light-sensitive recording materials containing a photopolymerizable and/or photocrosslinkable layer which are suitable for producing intaglio printing plates of high abrasion resistance and excellent mar resistance.

Intaglio printing is the printing method which gives excellent print quality over very long runs, the length of run varying with the printing stock from 500,000 to 5,000,000 cylinder revolutions. The utility of the printing plate is limited by the wear of the well-carrying layer or by mars on the surface which act like wells and become filled with ink.

Intaglio printing is predominantly done these days with copper cylinders covered with a thin layer of chromium. This layer of chromium contains the wells which receive the ink to be transferred and later transfer the ink to the printing stock. Excess ink present on the surface of the chromium after the wells have been filled is wiped off. During actual printing, the ink is transferred to the printing stock using an impression cylinder.

In the process used these days, the wells are introduced into the surface of the cylinder by engraving. This is costly, capital-intensive and slow. For this reason there are prior art proposals for the use of plastics surfaces for intaglio printing.

For instance, DE-A-2,752,500 recommends the use of an intaglio printing plate covered with a plastics layer, which is prepared by coating the printing plate carrier with a plastic and forming the ink-receiving recesses in the plastics layer by mechanical engraving. To improve the engraving properties of this plastics layer, it may contain pulverulent inorganic fillers from 0.01 to 10 μm in particle size. To avoid scratches and grooves on the surface of this intaglio printing plate, the steel doctor blade which is normally used should be replaced by a plastics doctor blade. However, the runs obtainable with intaglio printing plates produced in this way are not sufficiently long for commercial use at about 50,000 revolutions. Similarly, the production of intaglio printing plates is still resource-intensive, owing to the necessary mechanical engraving of the plastics surface.

It is further known to produce intaglio printing plates having a plastics printing layer using photopolymerizable materials as the material which forms the printing layer by forming the ink-receiving recesses in the surface of the printing layer as in the production of letterpress and flexographic printing plates by imagewise exposure of the photopolymerizable layer and subsequent washout of the unexposed areas. Processes for producing intaglio printing plates on the basis of photopolymerizable systems are described inter alia in DE-A-2,054,833, DE-A-2,061,287 and Japanese Patent Application 41,361/72. Intaglio printing plates of this type are generally based on photopolymerizable systems the same as or similar to those used for the production of photopolymerizable letterpress plates.

It is true that the use of these photopolymerizable systems make it possible to produce intaglio plates comparatively quickly, simply and flexibly in an economical manner, but the intaglio plates thus produced have proven to be insufficiently wear- and mar-resistant in practice. The steel doctor blades customarily used in intaglio printing do not bed down to the angle of attack set on the printing press without damaging the plastics printing layer. In addition, by forming sharp edges, holes, peaks, etc. they frequently cause scratches in the plastics surface and are responsible for the high wear of this layer. But even the use of plastics doctor blades as described in DE-A-2,752,500 does not bring about a significantly better result since the appreciably higher contact pressures required for the necessarily thick plastics blades cause substantial wear. For this reason even these intaglio printing plates only permit runs of no more than 50,000 copies.

It is likewise known to admix the photopolymerizable layers of recording materials which are suitable and used for producing letterpress plates, photoresists, relief images or offset plates with finely divided mineral fillers. These additives either serve simply as fillers or are used for obtaining a matted, roughened surface (cf. inter alia DE-A-2,403,487 and DE-A-2,926,236). In U.S. Pat. No. 3,782,939 it is mentioned that positive-working light-sensitive elements for the production of photoresists may be admixed with inorganic substances in order to improve mechanical properties, including for example the abrasion resistance. However, surface roughness does not matter with photoresist materials. The surfaces of intaglio plates, by contrast, must meet high requirements not only in respect of abrasion resistance but also in particular in respect of smoothness, flatness and absence of grooves, which is why the addition of finely divided mineral fillers to photopolymerizable recording materials was long considered unsuitable and disadvantageous for the production of intaglio printing plates.

EP-A-0,070,511 discloses light-sensitive recording materials for producing abrasion- and mar-resistant intaglio plates and processes for producing intaglio plates by means of these recording materials, which for the first time made it possible to obtain, in intaglio printing with cylinders having plastics surfaces, lengths of runs approaching those obtainable with conventional copper-chromium cylinders. This is made possible by the use of specific fillers which render the photocrosslinked and/or photopolymerized material abrasion- and mar-resistant.

In the course of practical use it has been found that the intaglio plates described in EP-A-0,070,511 should be improved still further in mar resistance.

It is an object of the present invention to improve the recording materials of EP-A-0,070,511 for use as intaglio printing plates of further improved mar resistance and further to raise the length of print run obtainable therewith.

We have found that, surprisingly, the use of bifunctional acrylates and/or methacrylates of cycloaliphatic epoxies in conjunction with polyvinyl alcohols or polyamides leads to photopolymerizable and/or photocrosslinkable layers which, following imagewise exposure, washout, drying and afterexposure, give intaglio printing plates of significantly improved mar resistance.

The present invention thus provides a light-sensitive recording material for the production of intaglio printing plates, comprising on a dimensionally stable base material a layer (L) from 30 to 500 μm thick of a photopolymerizable and/or photocrosslinkable material which is soluble or dispersible in a developer liquid and which, on exposure to actinic light, is rendered insoluble or no longer dispersible in this developer liquid and which, at least in a surface zone of from 1 to 50 μm of the surface of the layer (L) which forms the later surface of the printing plate, contains finely divided abrasive particles in such an amount that they account for from 2 to 50 % by weight of the photopolymerizable and/or photocrosslinkable material containing these particles, the average particle size of the abrasive particles being within the range from 0.1 to 6 μm, not more than 5 % of the abrasive particles having longitudinal dimensions greater than 10 μm and the abrasive particles having a hardness of >4.0 on the Mohs hardness scale, the surface of the layer (L) which forms the later surface of the printing plate having a peak-to-valley height of <2 μm and the constituents of the photopolymerizable and/or photocrosslinkable material of the layer (L) being chosen in such a way that this layer has after exposure, development and drying a hardness, measured under load, of not less than 10 N/mm² at least in the layer thickness range containing the ink-receiving recesses, wherein the photocrosslinkable and/or photopolymerizable material contains one or more cyclohexane derivatives of the general formula (I)

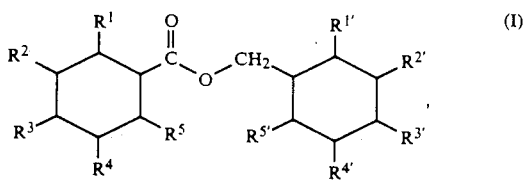

where one or more of the radicals $R^1$ to $R^5$ and $R^{1'}$ to $R^{5'}$ but no more than two of the radicals $R^1$ to $R^5$ and no more than two of the radicals $R^{1'}$ to $R^{5'}$ are each a group —O—C(O)—CR⁶=CH₂, where R⁶ is H or CH₃ one or more of the radicals $R^1$ to $R^5$ and $R^{1'}$ to $R^{5'}$ but no more than two of the radicals $R^1$ to $R^5$ and no more than two of the radicals $R^{1'}$ to $R^{5'}$ are each OH and the remaining radicals $R^1$ to $R^5$ and $R^{1'}$ to $R^{5'}$ are each H or CH₃.

According to the invention, it is advantageous to use mono-, di-, tri- and tetraacrylates and corresponding methacrylates of the formula (I).

Preference is given to those recording materials containing compounds of the formula (I) where hydroxyl and

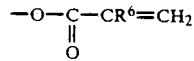

are on adjacent carbon atoms and those where one of the —OH or —O—C(O)—CR⁶=CH₂ radicals is para to the carbon atom of the cyclohexane ring via which the two cyclohexane rings are linked with each other via the —CO—O—CH₂—group.

Particularly preferred compounds of the general formula (I) are reaction products of 3,4-epoxycyclohexylmethyl 3',4'-epoxycyclohexanecarboxylate with acrylic acid or methacrylic acid in a molar ratio of from 1:1 to 1:2.5, in particular from 1:2 to 1:2.2.

In the recording materials according to the invention, it is also possible for up to 60, in particular from 30 to 50, % by weight of the compounds of the general formula (I) to have been replaced by one or more photopolymerizable and/or photocrosslinkable compounds.

Particularly advantageous recording materials according to the invention are those which contain as photopolymerizable and/or photocrosslinkable material a mixture of one or more compounds of the general formula (I) with a partially hydrolyzed polyvinyl acetate whose hydroxyl groups have been partly esterified with acrylic acid or methacrylic acid.

The present invention also provides for a process for producing an intaglio printing plate by exposing a light-sensitive recording material incorporating a photopolymerizable and/or photocrosslinkable layer (L) on a dimensionally stable base material to actinic light through a halftone or line positive or through a continuous tone positive and a screen grid drier then washing out the unexposed areas of the layer (L) with the aid of a developer liquid in which the unexposed areas but not the exposed areas of the layer (L) are soluble or dispersible, and drying and if necessary aftertreating the intaglio printing plate obtained, wherein the intaglio printing plate has been produced using a light-sensitive recording material according to the present invention.

It may here be particularly advantageous to subject the intaglio printing plate after washout and drying to a uniform afterexposure with actinic light and/or to a postcure at from 200° to 260° C.

The present invention thus makes it possible to produce in a simple, rapid and inexpensive manner intaglio printing plates which as regards quality substantially match conventional intaglio plates based on chromium-plated copper cylinders.

For the purposes of the present invention, intaglio printing plates are printing plates, sheets or cylinders which contain the ink-holding image areas for the print as recesses in the surface. In the intaglio printing plates according to the present invention, these ink-receiving recesses are situated in the photopolymeric layer, this photopolymeric printing layer having been firmly fixed to a printing plate carrier customarily made of metal, for example a steel plate or a steel cylinder. The thickness of the photopolymeric plastics printing layer and thus also the thickness of the photopolymerizable and/or photocrosslinkable layer (L) of the light-sensitive recording materials is in general within the range from 30 to 500 μm, preferably within the range from 50 to 250 μm. The depth of the wells, ie. ink-receiving recesses, is normally a few μm, for example from 2 to 3 μm, for wells of minimum depth and extends to values from about 10 to 100 μm, preferably from about 20 to 60 μm, for the deepest wells.

Suitable systems for use as the photosensitive material for the layer (L) of the light-sensitive recording materials according to the invention, being soluble or dispersible in a developer liquid and becoming insoluble or no longer dispersible therein on exposure to actinic light, are the conventional photopolymerizable and/or photocrosslinkable systems based on compounds having one or more photopolymerizable or photocrosslinkable double bonds and, according to the invention, containing one or more compounds of the general formula (I). The insolubilization of these materials in the developer liquids is due to a radiation-initiated polymerization or crosslinking of the unsaturated compounds.

The photopolymerizable and/or photocrosslinkable materials which come into consideration for the purposes of the invention include for example mixtures of one or more compounds of the general formula (I) which contain photopolymerization initiators, and also if desired further photopolymerizable olefinically unsaturated low molecular weight compounds as a mixture constituent. It is similarly possible to use polymers which contain a sufficient proportion of photopolymerizable olefinic double bonds in the molecule together with compounds of the formula (I) and one or more photopolymerization initiators. Preferably, the photopolymerizable and/or photocrosslinkable material of the layer (L) of the light-sensitive recording materials consists essentially of one or more saturated and/or unsaturated polymers, one or more photopolymerizable olefinically unsaturated low molecular weight compounds of the general formula (I) and one or more photopolymerization initiators, with or without further additives and/or assistants.

Suitable polymers for forming in general the bases for the photopolymerizable and/or photocrosslinkable materials are those synthetic polymers which are soluble in developer solvents that are known and customary for the production of photopolymerizable layers, in particular the production of relief plates for printing purposes. Examples are vinyl polymers, such as polyvinyl chloride, vinylidene chloride polymers, copolymers of vinyl chloride and vinyl esters of monocarboxylic acids of from 2 to 11 carbon atoms with or without a vinyl alcohol, polymers of predominant amounts of olefinically unsaturated carboxylic acids of 3 to 5 carbon atoms and/or esters thereof and/or amides thereof, for example polymers of acrylic acid, methacrylic acid, acrylamide, methacrylamide, acrylates or methacrylates of alkanols of from 1 to 12 carbon atoms or aliphatic diols and polyols, such as ethylene glycol, 1,4-butanediol or glycerol. Also suitable are polymers based on styrene or vinyl esters of monocarboxylic acids of from 2 to 11 carbon atoms, such as vinyl acetate and vinyl chloroacetate, polyformaldehyde, polyimides and polyamide-imides, polyurethanes, polyether-urethanes, polyesterurethanes, preferably with incorporated urea groups, melamine-formaldehyde or phenol-formaldehyde resins, and also in particular the customary unsaturated polyester resins of polybasic, in particular dibasic, carboxylic acids and polyhydric, in particular dihydric, alcohols. Suitable unsaturated polyesters are for example those whose acid components are derived from maleic acid, fumaric acid, itaconic acid, citraconic acid or mesaconic acid besides other unsaturated and/or saturated polybasic carboxylic acids and whose alcohol components come for example from alkanediols, such as ethylene glycol, 1,2- or 1,3-propanediol, 1,3-butylene glycol, 1,4-butanediol, 1,6-hexanediol, diethylene glycol, triethylene glycol, tetraethylene glycol or neopentylglycol.

Proven advantageous basic components for the photopolymerizable and/or photocrosslinkable materials are in particular vinyl alcohol polymers having CH2CH(OH) structural units in the polymer main chain and their copolymers and derivatives, such as esters, ethers or acetals, which are soluble or dispersible in water or aqueous developer liquids. Particular suitability is possessed by the known hydrolyzed polyvinyl esters of aliphatic monocarboxylic acids of from 1 to 4 carbon atoms, such as polyvinyl acetates or polyvinyl propionates, whose average degree of polymerization is from 200 to 3,000, in particular from 250 to 750, and whose degree of hydrolysis is from 65 to about 100, in particular from 80 to 88, mol %. It is also possible to employ mixtures of hydrolyzed vinyl ester polymers or copolymers having different degrees of polymerization and/or different degrees of hydrolysis. There may also be mentioned in this context in particular the reaction products of vinyl alcohol polymers with acrylic and/ or methacrylic anhydride which in general contain from 3 to 30 % by weight, based on the reaction product, of incorporated acryloyl or methacryloyl groups, as well as the water-soluble reaction products of vinyl alcohol polymers with ethylene oxide where the proportion of ethylene oxide units in the ethoxylated vinyl alcohol polymer is from 5 to 75 % by weight, in particular from 10 to 60 % by weight. These reaction products of vinyl alcohol polymers may be present as the sole polymer component in the polymerizable and/or photocrosslinkable materials; however, they may also be present mixed with other vinyl alcohol polymers, in particular the hydrolyzed polyvinyl esters mentioned, in which case the proportion of the reaction products of polyvinyl alcohol is advantageously not less than 30 % by weight, based on the total amount of vinyl alcohol polymer present in the mixture. In addition, it is possible for said vinyl alcohol polymers or copolymers and/or derivatives thereof to be admixed with up to about 30% by weight, based on the polymer content of the particular photopolymerizable and/or photocrosslinkable material, of compatible melamine-formaldehyde resins, urea-formaldehyde resins or phenol-formaldehyde resins.

Particularly suitable polymers for the photopolymerizable and/or photocrosslinkable materials also include the linear synthetic polyamides having recurring amide groups in the main chain of the molecule that are soluble in the customary organic, in particular alcoholic, solvents (as developer liquid). Of these polyamides, preference is given to the copolymers which are soluble in customary solvents or solvent mixtures, in particular in lower aliphatic alcohols, such as ethanol or n-propanol, or mixtures of these alcohols with water. They are for example copolyamides prepared in a conventional manner by polycondensation or polymerization from two or more lactams comprising from 5 to 13 ring members. Such lactams are for example pyrrolidone, caprolactam, enantholactam, capryllactam, laurolactam and corresponding C-substituted lactams, such as ε-methyl-ε-caprolactam, ε-ethyl-ε-caprolactam or δ-ethylenantholactam. Instead of the lactams their parent aminocarboxylic acids may have been polycondensed. Further suitable copolyamides are polycondensation products of salts of the diamine/dicarboxylic acid type prepared from 3 or more polyamide-forming starting materials. Dicarboxylic acids and diamines suitable for this purpose are preferably aliphatic dicarboxylic acids of from 4 to 20 carbon atoms, such as adipic acid, suberic acid, sebacic acid, dodecanedicarboxylic acid and corresponding substitution products, such as α,α-diethyladipic acid, α-ethylsuberic acid, 1,8-heptadecanedicarboxylic acid or 1,9-heptadecanedicarboxylic acid and mixtures thereof and also dicarboxylic acids which contain aliphatic or aromatic ring systems. Suitable diamines are in particular aliphatic or cycloaliphatic diamines having 2 primary and/or secondary amino groups, in particular of from 4 to 20 carbon atoms, such as pentamethylenediamine, hexamethylenediamine, heptamethylenediamine, octamethylenediamine or C- and/or N-substituted derivatives of these amines, such as N-methyl-N'-ethylhexamethylenediamine, 1,6-diamino-4-methylhexane, 4,4'-diaminodicyclohexylmethane or 2,2-(4,4'-diaminodicyclohexyl)propane, and also aromatic diamines, such as m-phenylenediamine, m-xylylenediamine or 4,4'-diaminodiphenylmethane, where in all starting materials the bridge members between the two carboxylic acid groups and amino groups may also be interrupted by hetero atoms, for example oxygen, nitrogen or sulfur atoms. Particularly suitable copolyamides are those which have been prepared by cocondensation of a mixture of one or more lactams, in particular caprolactam, and one or more dicarboxylic acid/ diamine salts, for example from ε-caprolactam, hexamethylenediammonium adipate and 4,4'-diaminocyclohexylmethane/ adipic acid salt.

The light-sensitive recording material according to the invention contains in the photopolymerizable and/or photocrosslinkable material one or more cyclohexane derivatives of the general formula (I), preference being given to those compounds of the formula (I) where OH— and —O—C(O)CR$^6$=CH$_2$ are on adjacent carbon atoms and para to the carbon atom of the cyclohexane ring via which the two cyclohexane rings are linked with one another via the —CO—O—CH$_2$ groups, for example the reaction product of 3,4-epoxycyclohexylmethyl 3',4'-epoxycyclohexanecarboxylate with acrylic acid or methacrylic acid in amounts of not less than 10 % by weight and not more than 50 % by weight, particularly preferably 20–45 % by weight, each based on the total amount of light-sensitive recording material.

The photopolymerizable, olefinically unsaturated low molecular weight compounds which may be used include the known monomers and oligomers having a molecular weight below 2000 which are known per se for photopolymerizable and/or photocrosslinkable materials and contain polymeric binders, although of course the nature and amount of the photopolymerizable low molecular weight compounds depends on the polymeric binder used, with which the compound should be compatible. Preference is given to photopolymerizable low molecular weight compounds having 2 or more ethylenically unsaturated photopolymerizable double bonds alone, or mixtures thereof with monomers having only one ethylenically unsaturated photopolymerizable double bond, in which case the proportion of monomer having only one double bond can in general be about from 5 to 50 % by weight, preferably from 5 to 30 % by weight, of the total amount of monomer. Under certain conditions it is of course also possible that any photopolymerizable low molecular weight compounds used comprise predominantly or exclusively those which contain only one photopolymerizable double bond in the molecule, in particular when the polymer present in the photopolymerizable and/or photocrosslinkable materials itself contains a high proportion of photopolymerizable double bonds, as is the case for example with acryloylated and/or methacryloylated vinyl alcohol polymers. In general, the photopolymerizable low molecular weight compounds have a boiling point of above 100° C. under atmospheric pressure.

Examples of photopolymerizable olefinically unsaturated low molecular weight compounds which may be used are: mono-di or polyacrylates and -methacrylates, such as can be prepared by esterifying acrylic acid or methacrylic acid with monohydric or polyhydric low molecular weight alcohols. They include inter alia the di- and tri(meth)acrylates of ethylene glycol, diethylene glycol, triethylene glycol, polyethylene glycols having a molecular weight of up to about 500, 1,2-propanediol, 1,3-propanediol, polypropylene glycols having a molecular weight of up to about 500, neopentylglycol (2,2-dimethylpropanediol), 1,4-butanediol, 1,1,1-trimethylolpropane, glycerol or pentaerythritol, and also the monoacrylates and monomethacrylates of such diols or polyols, as for example ethylene glycol mono(meth)acrylate, 1,2-propanediol mono(meth)acrylate, 1,3-propanediol mono(meth)acrylate and di-, tri- or tetraethylene glycol mono(meth)acrylate. Others which come into consideration are photopolymerizable olefinically unsaturated low molecular weight compounds which contain urethane groups and/or amide groups, such as those from aliphatic diols of the aforementioned type, organic diisocyanates, e.g. hexamethylene diisocyanate, toluylene diisocyanate and isophorone diisocyanate, and hydroxyalkyl(meth)acrylates of the low molecular weight compounds prepared as described above. Also possible are acrylic acid, methacrylic acid, (meth)acrylates of monoalkanols of from 1 to 6 carbon atoms, mono- and bis(meth)acrylamides of aliphatic or aromatic diamines of 2 to 8 carbon atoms, as of ethylenediamine, propylenediamine, butylenediamine, pentamethylenediamine, hexamethylenediamine, octamethylenediamine or xylylenediamine, as well as derivatives of (meth)acrylamide, for example N-hydroxymethyl(meth)acrylamide, or the reaction products of N-hydroxymethyl(meth)acrylamide with an aliphatic diol, for example ethylene glycol or propylene glycol.

The photopolymerizable and/or photocrosslinkable materials contain the polymers and the photopolymerizable olefinically unsaturated low molecular weight compounds in general in an amount of from about 50 to 90% by weight and from 10 to 50% by weight, respectively, each based on the total amount of the polymer and photopolymerizable low molecular weight compound. The proportion of photopolymerizable low molecular weight compound may in individual cases also be larger or smaller.

Suitable photopolymerization initiators, which are generally present in the photopolymerizable and/or photocrosslinkable materials in amounts from 0.05 to 10% by weight, in particular from 0.5 to 5% by weight, based on the total photopolymerizable and/or photocrosslinkable material, are the known and customary photopolymerization initiators and systems, the photopolymerization being initiated by irradiation with actinic light as described in the relevant literature. Specific examples are acyloins, and derivatives thereof, such as benzoin, benzoin alkyl ethers, for example benzoin methyl ether or benzoin isopropyl ether, α-methylolbenzoin and ethers thereof or α-methylbenzoin and ethers thereof, 1,2-diketones and derivatives thereof such as diacetyl, benzil, benzil ketals such as benzil dimethyl ketal, benzil methyl ethyl ketal, benzil methyl benzyl ketal, or benzil ethylene glycol monoketal, acyl phosphine oxide compounds, in particular acyl diaryl phosphine oxides and specifically acyl diphenyl phosphine oxides, whose acyl radicals are derived from tertiary aliphatic or cycloaliphatic carboxylic acids or from benzoic acids substituted at least in the 2,6-position, such as are described in detail in DE-A-2,909,992.

The photopolymerization initiators may be used alone or mixed with one another or even mixed with activators, for example tertiary amines. It is advantageous to use photopolymerization initiators of maximum activity. We have found, surprisingly, that intaglio printing plates photopolymerizable and/or photocrosslinkable materials contain, aside from photoinitiators of low absorption in the actinic wavelength range, in particular from 300 to 380 nm, for example the abovementioned benzoins, benzoin ether, benzil or benzil monoketals, in addition those photoinitiators whose extinction coefficients ε at 360 nm are >500 cm$^2$/mmol, in particular >5000 cm$^2$/mmol. Examples of such strongly absorbing co initiators are 4,4'-bis(N-dimethylamino)benzophenone (Michler's ketone) and also derivatives of Michler's ketone, for example the 4,4'-bis-(N-hydroxyalkyl-N-alkylamino)benzophenone described in EP-A1-0,000,342, such as 4,4'-bis(N-β-hydroxyethyl-N-methylamino)benzophenone, 4,4'-bis(N-β-N-ethylamino)benzophenone, 4,4'-bis(N-β-hydroxyethyl-N-propylamino)benzophenone, 4,4'-bis(N-β-hydroxypropyl-N-methylamino)benzophenone and 4,4'-bis(N-hydroxypropyl-N-ethylamino)benzophenone. In the advantageous initiator combination of strongly absorbing and weakly absorbing initiators, the molar ratios and amounts known for Michler's ketone may be used. Customarily, the strongly absorbing initiators are present in the photopolymerizable and/or photocrosslinkable materials in amounts of from about 0.05 to 0.4% by weight, preferably from 0.1 to 0.25% by weight, depending on the thickness of the layer containing these initiators, the ratio of strongly absorbing initiator to weakly absorbing coinitiator varying with the desired exposure properties and being for example 1:10.

It is frequently advantageous to add other customary assistants and additives. These include in particular inhibitors of thermal polymerization, such as hydroquinone, p-methoxyphenol, m-dinitrobenzene, p-quinone, methylene blue, β-naphthol, N-nitrosamines, such as N-nitrosodiphenyleneamine, or the salts, in particular the alkali metal and aluminum salts, of N-nitrosocyclohexylhydroxylamine. These inhibitors are generally used in amounts of from 0.01 to 2.0 % by weight, based on the total photopolymerizable and/or photocrosslinkable material. These materials may in addition contain further additives comprising for example plasticizers, dyes, pigments or the like.

In a particularly advantageous embodiment of the present invention, the photopolymerizable layer may also contain a regulant system as described for example in EP-A-114,341.

These regulant systems comprise mixtures of certain dyes (1) with mild reducing agents (2) for the particular dye (1) used (cf. also EP-A-0,114,341). The mixture of (1) +(2) should not cause any noticeable photopolymerization in the layer of the photopolymerizable mixture on imagewise exposure to actinic light, which is ascertainable in a few experiments. If for example the exposure time for preferably essentially solvent-free layers of the photopolymerizable photoinitiator-containing mixture according to the invention is x hours or minutes, the corresponding layer which does not contain photoinitiator advantageously should not, even if ten times the exposure time is employed, contain any significant proportions of photopolymerized layer in the course of the subsequent developing of the relief plate by washing out: in general, less than 20% by weight of the exposed quantities of monomer should be photopolymerized.

Suitable dyes (1) for the photopolymerizable mixtures are in particular those from the series of the phenoxazine dyes, for example Capri Blue GN (C.I. 51000), Zapon Fast Blue 3 G (C.I. 51005), Gallo Blue E (C.I. 51040), Fast New Blue 3 (C.I. 51175), Nile Blue A (C.I. 51180), Fast Green M (C.I. 51210), Fast Black L (C.I. 51215), and Rhodanil Blue, the salt or amide of Rhodamine B (Basic Violet 10, C.I. 45170) and Nile Blue (Basic Blue 12, C.I. 51180), compounds from the series of the phenazinium dyes, for example Neutral Red (C.I. 50040), Neutral Violet (C.I. 50030), Azine Scarlet G (C.I. 50045), Rhoduline Heliotrope 3 B (C.I. 50055), Neutral Blue C (C.I. 50150), Azine Green GB (C.I. 50155), Safranine B (C.I. 50200), Idamine Blue B (C.I. 50204), Rhoduline Red G (C.I. 50215), Rhoduline Blue GG Extra (C.I. 50220), Indazine GB (C.I. 50221), Safranine T (C.I. 50240), mauveine (C.I. 50245), Naphthyl Red (C.I. 50370) and Nigroin Black T (C.I. 50415), acriflavin (C.I. 46000), Acridine Orange (C.I. 46005), Acridine Scarlet J (C.I. 46015), Acridine Yellow G (C.I. 46025), Aurazine G (C.I. 46030), Brilliant Phosphine GG (C.I. 46035), Phosphine E (C.I. 46045), flaveosine (C.I. 46060), benzoflavin (C.I. 46065) and Rheonine A (C.I. 46075), and also phenothiazinium dyes, for example methylene blue or thionine. Similarly, (isobutylthio)anthraquinone is suitable for use as dye (1).

The choice of dye (1) used in the photopolymerizable mixture is influenced in particular by esthetic considerations. For instance, visual evaluation of printing plates is particularly simple with the compounds Neutral Red (C.I. 50040), Safranine T (C.I. 50240) and Rhodanil Blue, which are preferably used in the photopolymerizable mixture.

The layers according to the invention contain combined with dye (1) a sufficient amount of a reducing agent (2) for the dye (1) which does not reduce the dye (1) in the absence of actinic light but on exposure to light can reduce the dye in the excited electronic state, in particular to the semiquinone. Examples of such mild reducing agents are ascorbic acid, anethole, thiourea, diethylallylthiourea, hydroxylamine derivatives, in particular N-allylthiourea and preferably salts of N-nitrosocyclohexylhydroxylamine, in particular the potassium and aluminum salts. The latter are also known for use as inhibitors of thermal polymerization in photopolymerizable mixtures. The amount of reducing agent added is in general from about 0.005 to 5, in particular from 0.01 to 1, % by weight, based on the total amount of photopolymerizable layer, but should not be less than the reduction equivalent of the amount of dye (1) used. In many cases, the addition of from 3 to 10 times the amount of dye (1) used has proved useful.

The light-sensitive recording material for the production of intaglio printing plates contains in the photopolymerizable and/or photocrosslinkable layer (L) finely divided hard abrasive particles. The average size of the abrasive particles should be within the range from 0.1 to 6 μm, with not more than 5%, preferably less than 1%, of the abrasive particles having longitudinal dimensions greater than 10 μm. The average size of the abrasive particles can be determined in a conventional manner, in particular by sedimentation analysis. The longitudinal dimension of a particle is the projected distance between two points on the particle surface. The longitudinal dimensions of a particle may be determined for example in a conventional manner under the microscope.

The hardness of the abrasive particles should be >4.0 on the Mohs hardness scale. Advantageously, the hardness of the abrasive particles is 6 or more on the Mohs hardness scale. The abrasive particles which come into consideration for the purposes of the present invention are in particular mineral fillers and pigments, for example silicon dioxide, in particular quartz powder and cristobalite, silicates, in particular aluminum silicate, silicate glasses, aluminum oxides, in particular corundum, titanium dioxide, silicon carbide, tungsten carbide and the like. These finely divided abrasive particles may also have been surface treated or coated in a conventional manner, for example in order to improve the dispersibility and/or the adhesion in the photopolymerizable and/or photocrosslinkable layer (L).

It is advantageous to use those abrasive particles which substantially transmit actinic light, and it is a further advantage if the refractive indices of the abrasive particles and of the photopolymerizable and/or photocrosslinkable material used as layer (L) have been adapted to one another. In such an event, the use of silicon dioxide, in particular quartz powder and cristobalite, as abrasive particles has proved highly favorable.

The abrasive particles may be present and uniformly distributed in the entire photopolymerizable and/or photocrosslinkable layer (L).

In those cases where the abrasive particles are present only in a surface zone of the photopolymerizable and/or photocrosslinkable layer (L) of from 1 to 50 $\mu$m, preferably from 5 to 20 $\mu$m, thickness, it is possible to use light-scattering abrasive particles without significant impairment of the exposure properties of the light-sensitive recording materials; that is, the refractive indices of the abrasive particles and that of the photopolymerizable and/or photocrosslinkable material containing them can be different. Finely divided abrasive particles here may transmit actinic light, ie. be non-absorbing, but they may also absorb actinic light. If the photopolymerizable and/or photocrosslinkable materials contain finely divided abrasive particles which do not transmit actinic light, ie. which are strongly absorbing of actinic light, these abrasive particles are advantageously present only in a surface zone of the layer (L) from 1 to 50 $\mu$m, preferably from 5 to 20 $\mu$m, in thickness even if the refractive indices of the abrasive particles and that of the photopolymerizable and/or photocrosslinkable material containing them have been adapted to one another. If light-scattering and/or light-absorbing abrasive particles are used, it is advisable and favorable to adapt the thickness of the surface zone containing the abrasive particles to the degree of light scattering and absorption.

The abrasive particles are present in the photopolymerizable and/or photocrosslinkable layer (L) in an amount of from 2 to 50% by weight, preferably from 5 to 30% by weight, based on that part of the layer (L) which contains the abrasive particles, so that in the case where the entire layer (L) contains the abrasive particles the specifications are based on the entire photopolymerizable and/or photocrosslinkable material, and in the case where the abrasive particles are present only in a surface zone of the layer (L), these specifications are based only on that part of the photopolymerizable and/or photocrosslinkable material which represents this surface zone that contains the abrasive particles. Suitable photopolymerizable and/or photocrosslinkable materials that contain abrasive particles thus in general consist essentially of from 30 to 90 % by weight of polymers as the basic material, from 10 to 50 % by weight of photopolymerizable olefinically unsaturated low molecular weight compounds, from 0.05 to 10% by weight, in particular from 0.2 to 5% by weight, of photopolymerization initiators, from 2 to 50% by weight, preferably from 5 to 30% by weight, of abrasive particles with or without further customary auxiliary and additive substances in customary and known amounts, the stated weight percentages each being based on the photopolymerizable and/or photocrosslinkable material that contains the abrasive particles.

If the photopolymerizable and/or photocrosslinkable layer (L) of the light-sensitive recording materials contains the abrasive particles only in a thin surface zone while the remaining part of the photopolymerizable and/or photocrosslinkable layer (L) contains no abrasive particles, if thus the photopolymerizable and/or photocrosslinkable layer (L) consists of a plurality of sublayers, it is possible for the individual layers of the photopolymerizable and/or photocrosslinkable layer (L) with the exception of the abrasive particles to consist of otherwise identical photopolymerizable and/or photocrosslinkable materials. However, it is similarly possible for the photopolymerizable and/or photocrosslinkable materials of these sublayers also to differ in respect of the other constituents, for example the nature and amount of the basic polymer, nature and amount of the photopolymerizable olefinically unsaturated low molecular weight compounds or nature and amount of photopolymerization initiators. For instance, it is particularly favorable if a multi-layered layer (L) contains in the sublayer which contains the abrasive particles a mixture of a weakly absorbing and a strongly absorbing initiator of the type described above as the photopolymerization initiator, while the sublayer of layer (L) which is free of abrasive particles contains only one or more weakly absorbing initiators. Preferably, in a multilayered layer (L) the polymers and photopolymerizable low molecular weight compounds in the photopolymerizable and/or photocrosslinkable materials of the individual sublayers are identical or at least similar and mutually compatible.

The dimensionally stable base material for the photopolymerizable and/or photocrosslinkable layer (L) is in general the actual printing plate base, but it may also be a temporary base which is used for example for storing and transporting the photopolymerizable and/or photocrosslinkable layer (L) and which after the layer (L) has been applied to the actual printing plate base is then peeled off the layer (L) and removed. A printing plate base is in general either a steel cylinder or a platelike sheet of steel. To obtain good adhesion between the photopolymerizable and/or photocrosslinkable layer (L) and the printing plate base it is frequently advantageous before the layer (L) is applied to provide the printing plate base with a thin layer of an adhesion promoter based for example on polyurethane reactive coatings, phenolic resins and/or epoxy resins. Suitable materials for the temporary base are in particular dimensionally stable plastics films in general from 50 to 250 $\mu$m, in particular from 75 to 150 $\mu$m, in thickness. Preferably, the temporary base consists of a polyester film, in particular a polyethylene terephthalate or polybutylene terephthalate film.

The light-sensitive recording materials according to the invention are customarily produced by first intimately mixing the constituents of the photopolymerizable and/or photocrosslinkable materials with one another and then applying this mixture in the form of the layer (L) to the dimensionally stable base. The mixing of the constituents of the photopolymerizable and/or photocrosslinkable materials may be carried out in a conventional manner in solution, in a kneader or any other mixing apparatus capable of bringing about an intimate mixture and a very homogeneous dispersion of the individual constituents. If the mixture obtained is present in solid form, the layer (L) may subsequently be formed by extruding, calendering or press molding the photopolymerizable and/or photocrosslinkable material with either simultaneous or subsequent laminating onto the dimensionally stable base. To obtain the desired smooth surface on the layer (L) with a peak-to-valley height of <2 μm, preferably <1 μm, in a simple manner, the layer (L) is preferably produced by casting a solution of the photopolymerizable and/or photocrosslinkable material onto the dimensionally stable base. In this case, it will be readily understood that it is advantageous to perform the mixing of the constituents of the photopolymerizable and/or photocrosslinkable material in solution. Possible solvents for the casting solutions, the choice of which also depends on the nature and composition of the photopolymerizable and/or photocrosslinkable material, are the solvents customarily known for this purpose, for example alcohols, ethers, esters, ketones, aliphatic halogenated hydrocarbons, aromatic hydrocarbons and the like.

Advantageously, the photopolymerizable and/or photocrosslinkable layer (L) is first applied to a temporary base, in particular a polyester film, and then, either before or after exposure, laminated onto the actual printing plate base. This procedure has proved favorable in particular if platelike printing plate bases are used for the production of printing plates. Here it is generally the case that the surface of the layer (L) remote from the temporary base is applied to the printing plate base, so that the surface of the layer (L) facing the temporary base subsequently forms the actual surface of the printing plate.

If desired, the surface of the photopolymerizable and/or photocrosslinkable layer (L) which later forms the surface of the actual printing layer of the intaglio printing plate may additionally be provided with a thin, up to about 5 μm thick, preferably from 1 to 4 μm thick, layer which transmits actinic light but which inhibits the diffusion of oxygen into the photopolymerizable and/or photocrosslinkable layer (L) and thus prevents any oxygen inhibition of the photopolymerization resulting from the exposure of the light-sensitive recording materials according to the invention. Such oxygen barrier layers are known per se in connection with light-sensitive recording materials for the production of letterpress plates or photoresists and, in the case of the recording materials according to the invention for the production of abrasion- and mar-resistant intaglio printing plates, may consist of the conventional materials customary for oxygen barrier layers, in particular plastics. The oxygen barrier layer must be soluble in the developer solvent for the photopolymerizable and/or photocrosslinkable layer (L) and, following exposure of the recording materials, is washed out together with the unexposed areas of the layer (L).

Further details concerning application and processing of the photopolymerizable layers may be found in EP-A-0,070,511.

The photopolymerizable and/or photocrosslinkable materials for the layer (L) of the light-sensitive recording materials according to the invention should be chosen in such a way that the printing layer of the intaglio printing plate produced therefrom has at least in the layer thickness range containing the ink-receiving depressions a Vickers hardness, measured under load, of not less than 10 N/mm². In general, the printing layer will have a uniform hardness over the entire layer thickness. However, it is also possible and sufficient for the printing layer to have the required hardness only within a surface zone down to a depth within the layer which corresponds to the depth of the ink-receiving wells, while the areas of the printing layer underneath may be for example flexible and resilient. Effectively, the hardness of the printing layer is affected not so much by the nature and quantity of the abrasive particles but more by the basic polymer used in the photopolymerizable and/or photocrosslinkable materials and the degree of crosslinking produced in the photopolymerization, ie. on the nature and the amount of the monomers and on the photoinitiator used. The constitution required for the photopolymerizable and/or photocrosslinkable material, having regard to the observations made above in this connection, for the material to have the desired hardness following exposure is easy to determine for the skilled worker in a few preliminary trials. The hardness of the printing layer or even of zones of the printing layer, in particular the surface zone, may if required be varied and even enlarged by aftertreatment steps on the exposed and developed printing plate, as will be described hereinafter in more detail.

The choice of materials, in particular the choice of basic polymer for the photopolymerizable and/or photocrosslinkable materials, is affected by the application area of the intaglio printing plates in that the printing layer must be resistant to the solvents used for the printing inks. The most commonly used solvents in intaglio printing inks are toluene and alcohol, ie. low-boiling aliphatic hydrocarbons. Since the photopolymeric printing layers are not equally resistant to all solvents, the choice of the basic polymer for the photopolymerizable and/or photocrosslinkable materials also depends on the printing ink solvents employed in intaglio printing. For the most widely used printing inks based on toluene or alcohol as solvents, it has proven useful to produce the intaglio printing plates in particular from those materials which contain in the layer (L) as the basic polymer a polyamide or copolyamide or a vinyl alcohol polymer or partly hydrolyzed vinyl ester polymer.

To produce the intaglio printing plates, the light-sensitive recording materials according to the invention are irradiated with actinic light through a suitable image original, thereby causing the exposed areas of the layer (L) to photopolymerize and crosslink and thus become insoluble in the developer liquid while the unexposed areas remain soluble and can be washed out with the developer liquid.

If the photopolymerizable and/or photocrosslinkable layer (L) has been applied to a temporary base, it can be laminated onto the printing plate base even prior to exposure and then be exposed. Exposure can then take place either after the temporary base has been peeled off the layer (L) or through the temporary base, in which case the latter is not peeled off until after exposure. Alternatively, it is also possible to expose the photopolymerizable and/or photo-crosslinkable layer (L) present on the temporary base even before it is laminated onto the printing plate base.

The light-sensitive recording materials are exposed using light sources which are capable of emitting actinic light within the wavelength region from in general 250 to 700 nm, preferably within the range from 300 to 500 nm, and whose emission maxima are in general within the absorption region of the photoinitiators. To produce the intaglio printing plates according to the invention, it is possible to use the light sources customary in reproduction technology, such as carbon arc lamps, actinic or superactinic fluorescent tubes, mercury low, medium and high pressure lamps, which may be doped, and also xenon lamps or lasers having high UV contents, for example argon ion lasers with a UV output power of from 1 to 2 watts. This process of exposure may be carried out in customary and conventional contact copying frames (in the case of plates or sheets) or on commercial rotary exposure units (in the case of cylinders). The image original used in the exposure step may be a customary halftone or line positive or else a continuous tone positive combined with a screen grid.

The exact exposure time depends on the nature of the material used for the photopolymerizable and/or photocrosslinkable layer (L). It is customarily within the range from 0.5 to 10 minutes and is easy to determine for the layer material used in a few preliminary trials. The exposure time should in particular be sufficiently long for the surface zone of the layer (L) which contains the abrasive particles to polymerize and crosslink completely and to be impervious to the developer liquid during the subsequent washout. The washout or developing of the recording materials subjected to imagewise exposure in order to remove the unexposed and thus still soluble areas of the layer to form the grid and well structure typical of intaglio printing plates is effected in a conventional manner by treating the recording materials which have been subjected to imagewise exposure with the developer liquid, for example in a developer liquid bath, a spray washer or a brush washer or in some other suitable manner.

Suitable developer liquids and washout solvents are especially those solvents and solvent mixtures in which the unexposed photopolymerizable and/or photocrosslinkable material is readily soluble or at least easily dispersible while the photopolymerized materials after exposure are insoluble or no longer dispersible therein. The choice of a suitable developer liquid depends on the composition of the photopolymerizable and/or photocrosslinkable material, in particular on the nature of the polymer present therein. Preference is given to choosing those developer liquids which are ecologically and hygienically safe, ie. which can be handled without special safety precautions and which are simple and easy to purify and recover. Examples of developer liquids are lower aliphatic alcohols, mixtures of alcohols and water or even water itself. Suitable developer liquids for photopolymerizable and/or photocrosslinkable materials based on vinyl alcohol polymers or unsaturated polyester resins are for example water and aqueous alkaline solutions; suitable developer liquids for photopolymerizable and/or photocrosslinkable materials based on copolyamides are lower aliphatic alcohols, in particular mixtures of those alcohols with water, for example mixtures of ethanol with water in a ratio of 8:2.

The treatment of the exposed intaglio printing plates with developer liquid, ie. the process of washing out unexposed areas, is preferably carried out at temperatures at which the process of washing out is complete within a very short period, ie. within from about 1 to 10 minutes, without however the exposed areas of the photopolymeric intaglio printing plates being attacked by developer liquid. For most developer liquids, washout temperatures of from 10° C. to 40° C. are advantageous. It is advisable to remove these solvent residues by a brief drying operation subsequent to the washout operation. The drying operation may take place at room temperature or alternatively at elevated temperatures, for example within the range from 50° C. to 120° C. Drying at elevated temperatures has the additional advantage that it may also serve to increase the hardness of the printing layer.

In some cases, in particular in the case of intaglio printing plates whose printing layers contain polyamides, copolyamides or vinyl alcohol polymers as basic polymers, it has proven advantageous to subject the intaglio printing plate, after it has been dried by briefly heating it to within the range from 200° C. to about 260° C., preferably to within the range from 220° to 240° C., to an additional cure. This postcure at high temperatures generally requires no more than from 5 to 60 minutes; however, longer postcure times are also possible. In the course of this subsequent cure, the photopolymeric layer is baked, and its Vickers hardness measured under load increases to above 200 $N/mm^2$. Simultaneous discoloration of the layer toward pale to dark brown shades during the postcure is harmless not only in respect of its mechanical but also in respect of its printing properties.

Furthermore, in some cases it has proven to be advantageous to subject the intaglio printing plate produced according to the invention to a further uniform exposure after washout and drying.

The intaglio printing plates produced according to the invention are suitable for use in conventional intaglio printing presses and give results which, depending on the technique used and the nature of the photopolymerizable and/or photocrosslinkable material used, are identical to the results obtained with conventional intaglio printing plates. A significant advantage of the intaglio printing plates produced according to the invention over conventional intaglio printing plates based on chrome-plated copper cylinders is their simple and quick method of production without lagging behind the conventional intaglio printing plates as regards printing. More particularly, the intaglio printing plates produced according to the invention are notable, especially if compared with existing intaglio printing plates based on plastics printing layers, for their high abrasion and mar resistance, so that it is possible to obtain runs with the intaglio printing plates produced according to the invention of from 500,000 to 1,000,000 copies of consistently good quality, including in particular in respect of continuous tone reproduction. It is further particularly noteworthy that in intaglio printing with the intaglio printing plates produced according to the invention it is possible, unlike in the case of existing intaglio printing plates based on plastics printing layers, to use the conventional customary steel doctor blades without thereby damaging the printing layer or the steel doctor blade in any way. If intaglio printing plates produced according to the invention are used, the steel doctor blades bed down uniformly at the surface of the photopolymeric printing layer in the same way as in the case of conventional intaglio printing plates. In intaglio printing with the intaglio printing plates produced according to the invention, resilient steel doctor blades having rounded edges and a surface hardness of not less than 350 (Vickers hardness according to German Standard Specification DIN 50 133) as described in DE-A-3,110,842 have proven particularly advantageous. If the intaglio printing plates produced according to the invention are damaged in use, for example by faulty doctor blades or the like, and have mars, ridges or grooves, they can be polished smooth in the same way as conventional intaglio printing plates.

The invention is illustrated by the Examples below. Parts are by weight, unless otherwise stated.

The hardness of the plate is measured by means of an apparatus for determining the Brinell hardness (see German Standard Specification DIN 53456) under load by measuring the depth of penetration of a quartz ball having a diameter of 5.926 mm.

To test the mar resistance, the sample is clamped onto a rotatable plate and exposed under various loads to a conical diamond engraving tool (90° conical angle and 90 μm tip radius). The load is increased until cracks become visible to the naked eye. The mars thus obtained are measured out. The mar resistance is defined as the force which causes a mar which is just detectable with a surface-measuring instrument (for example the Perthometer from Perthen); such a mar is about 0.5 μm deep.

EXAMPLE 1

A 200 μm thick photopolymerizable layer consisting of 54 parts of a partially hydrolyzed polyvinyl acetate (degree of hydrolysis 88%) esterified with 3% of methacrylic acid, 36 parts of an aliphatic epoxy acrylate of the formula (I) where $R^2 = R^{2'} = -OH$ and

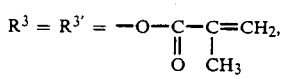

10 parts of aminosilane-treated quartz powder (with 95% of the particles finer than 5 μm and 50% of the particles finer than 2 μm; for example Silbond® 800 AST from Quartzwerke Frechen), 1.5 parts of benzil dimethyl ketal, 0.5 part of the potassium salt of N-nitrosocyclohexylhydroxylamine and 0.05 part of Safranine T (C.I. 50240) is applied to a piece of sheet metal bearing an adhesion-promoting coating. Following exposure, washout in water and drying, the ball impression hardness is 126 N/mm². A first mar becomes visible under a load of 1.2 N. A load of 2.1 N produces a mar 1 μm deep.

COMPARATIVE EXAMPLE 1

If the epoxy acrylate mixture of formula (I) described in Example 1 is replaced by an aliphatic diacrylate, for example dicyclopentenyl diacrylate, as the monomer, the treatment gives a plate having a ball impression hardness of 118 N/mm². A first mar becomes visible under 0.67 N. A load of 2.1 N produces a mar 4 μm deep.

EXAMPLE 2

A photopolymerizable mixture such as described in Example 1, where the monomer component used is the product of reacting 3,4-epoxycyclohexylmethyl 3',4'-epoxycyclohexanecarboxylate with methacrylic acid in a molar ratio of 1:2.2, is exposed in the same manner, washed out with water, dried and afterexposed. The hardness of the plate is 127 N/mm². A first mar occurs under a load of 1.67 N. A force of 2.1 N leaves a mar 1 μm deep.

EXAMPLE 3

A solution of 58 parts of a copolyamide of approximately equal parts of hexamethylenediamine adipate, 4,4'-diaminocyclohexylmethane adipate and ε-caprolactam, which is soluble in aqueous alcohol, 30 parts of a monomer of the general formula (I) where one each of the radicals $R^2$ or $R^3$ and $R^{2'}$ or $R^{3'}$ is OH and the other one is

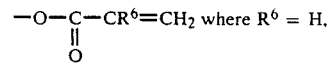

10 parts of the quartz powder specified in Example 1, 1.2 parts of benzil dimethyl ketal, 0.6 part of the potassium salt of N-nitrosocyclohexylhydroxylamine and 0.04 part of Safranine T is used to produce a printing plate by applying the mass to dimensionally stable base in a film thickness of from 100 to 200 μm. Following imagewise exposure, development in aqueous alcohol, drying and afterexposure the plate obtained has a well defined relief and a smooth surface. The Brinell hardness is 40 N/mm², a mar requiring a force of not less than 0.9 N/mm². A load of 2.1 N gives a mar 3 μm deep.

EXAMPLE 4

Example 3 is repeated, except that the monomer component used comprises a 1:1 mixture of the corresponding acrylate ($R^6 = H$) and methacrylate ($R^6 = CH_3$). The Brinell hardness is 25 N/mm², the first mar requiring a force of 0.6 N. A load of 2.1 N produces a mar 4 μm deep.

COMPARATIVE EXAMPLE 2

A photopolymerizable mixture consisting of 58 parts of a copolyamide as described above, 30 parts of a linear, saturated triacrylate, 10 parts of quartz powder, 1.5 parts of benzil dimethyl ketal, 0.3 part of potassium salt of N-nitrosocyclohexylhydroxylamine and 0.03 part of Safranine T is formed into a printing plate by applying a 200 μm layer to a dimensionally stable base, exposed, washed out in aqueous alcohol, dried and afterexposed. The plate thus obtained has a Brinell hardness of 24 N/mm². A force of 0.4 N produces a mar 1 μm deep. A load of 2.1 N produces a mar 7 μm deep.

EXAMPLE 5

Example 1 is repeated, except that 15 % of the monomer of the formula (I) is replaced by polyethylene glycol 400 dimethacrylate (from Röhm).

The ball impression hardness of an intaglio printing plate produced from such a formulation is 113 N/mm². A first mar becomes visible under a load of 0.7 N. A load of 2.1 N produces a mar of 1.5 μm.

We claim:

1. A light-sensitive recording material for the production of intaglio printing plates, comprising on a dimensionally stable base material a layer (L) from 30 to 500 μm thick of a photopolymerizable and/or photocrosslinkable material which is soluble or dispersible in a developer liquid and which, on exposure to actinic light, is rendered insoluble or no longer dispersible in this developer liquid and which, at least in a surface zone of from 1 to 50 μm of the surface of the layer (L) which forms the later surface of the printing plate, contains finely divided abrasive particles in such an amount that they account for from 2 to 50 % by weight of the photopolymerizable and/or photocrosslinkable material containing these particles, the average particle size of the abrasive particles being within the range from 0.1 to 6 μm, not more than 5 % of the abrasive particles having longitudinal dimensions greater than 10 μm and the abrasive particles having a hardness of >4.0 on the Mohs hardness scale, the surface of the layer (L) which forms the later surface of the printing plate having a peak-to-valley height of <2 um and the constituents of the photopolymerizable and/or photocrosslinkable material of the layer (L) being chosen in such a way that this layer has after exposure, development and drying a hardness, measured under load, of not less than 10 N/mm² at least in the layer thickness range containing the ink-receiving recesses, wherein the photocrosslinkable and/or photopolymerizable material contains one or more cyclohexane derivatives of the formula (I)

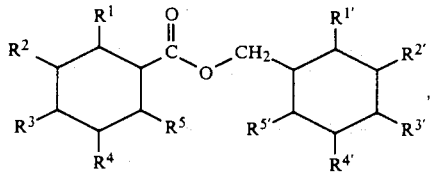

where one or more of the radicals $R^1$ to $R^5$ and $R^{1'}$ to $R^{5'}$ but no more than two of the radicals $R^1$ to $R^5$ and no more than two of the radicals $R^{1'}$ to $R^{5'}$ are each a group —O—C(O)—CR⁶=CH₂ where $R^6$ is H or CH₃, one or more of the radicals $R^1$ to $R^5$ and $R^{1'}$ to $R^{5'}$ but no more than two of the radicals $R^1$ to $R^5$ and no more than two of the radicals $R^{1'}$ to $R^{5'}$ are each OH and the remaining radicals $R^1$ to $R^5$ and $R^{1'}$ to $R^{5'}$ are each H or CH₃.

2. The recording material of claimed in claim 1, wherein hydroxyl and

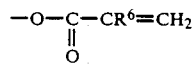

are each on adjacent carbon atoms.

3. The recording material of claim 1, wherein one each of

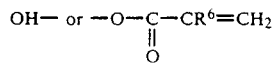

is para to the carbon atom of the cyclohexane ring via which the two cyclohexane rings are linked to one another via the

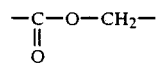

group.

4. The recording material of claim 2, wherein one each of

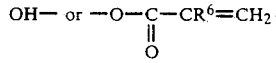

is para to the carbon atom of the cyclohexane ring via which the two cyclohexane rings are linked to one another via the

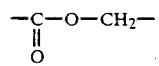

group.

5. The recording material of claim 1, wherein the compound of the formula (I) is a reaction product of 3,4-epoxycyclohexylmethyl 3',4'-epoxycyclohexanecarboxylate with acrylic acid or methacrylic acid in a molar ratio of from 1:1 to 1:2.5.

6. The recording material of claim 1, wherein not more than 60% by weight of the second of the formula (I) has been partly replaced by one or more further photopolymerizable or photocross-linkable compounds.

7. The recording material of claim 1, wherein the photopolymerizable of photocrosslinkable material used is a mixture of a compound of the formula (I) with a partially hydrolyzed polyvinyl acetate whose hydroxyl groups have been partly esterified with acrylic acid or methacrylic acid.

* * * * *